United States Patent
Horiguchi

(10) Patent No.: US 9,183,209 B2
(45) Date of Patent: *Nov. 10, 2015

(54) COMMUNICATION DEVICE WITH FAST START MODE FOR TRANSFERING DATA TO TEMPORARY AREAS BEYOND FILE SYSTEM CONTROL

(75) Inventor: Tomoya Horiguchi, Inagi (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 566 days.

This patent is subject to a terminal disclaimer.

(21) Appl. No.: 13/564,222

(22) Filed: Aug. 1, 2012

(65) Prior Publication Data

US 2013/0198247 A1  Aug. 1, 2013

Related U.S. Application Data

(63) Continuation of application No. PCT/JP2010/051439, filed on Feb. 2, 2010.

(51) Int. Cl.
*G06F 12/02* (2006.01)
*G06F 17/30* (2006.01)
(Continued)

(52) U.S. Cl.
CPC .......... *G06F 17/30091* (2013.01); *G11C 16/06* (2013.01); *G11C 16/102* (2013.01)

(58) Field of Classification Search
CPC ..... G06F 3/0611; G06F 3/0655; G06F 3/061; G06F 12/0246; G06F 17/30091; G11C 16/102; G11C 16/06
USPC .................................................. 711/103, 209
See application file for complete search history.

(56) References Cited

U.S. PATENT DOCUMENTS 5,341,330 A * 8/1994 Wells et al. ............... 365/185.33
5,623,606 A * 4/1997 Yokoyama et al. ........... 709/232
5,787,445 A * 7/1998 Daberko ............................. 1/1
(Continued)

FOREIGN PATENT DOCUMENTS

JP  5-100296 A  4/1993
JP  10-134559 A  5/1998
(Continued)

OTHER PUBLICATIONS

Kim, Hyojun, and Seongjun Ahn. "BPLRU: A Buffer Management Scheme for Improving Random Writes in Flash Storage." FAST. vol. 8. 2008.*
(Continued)

*Primary Examiner* — Hiep Nguyen
(74) *Attorney, Agent, or Firm* — Ohlandt, Greeley, Ruggiero & Perlo, L.L.P.

(57) ABSTRACT

According to one embodiment, a communication device includes a data storage device and following units. The reception unit receives data from another communication device. The data storage device includes a data area controlled by a file system and a temporary area beyond control of the file system. The processing unit operates in one of first and second start modes, the processing unit being started faster in the second start mode than in the first start mode. The processing unit operating in the second start mode writes the received data to the temporary area, copies the received data in the temporary area to the data area after completion of data reception, and erases the received data in the temporary area after copying.

6 Claims, 6 Drawing Sheets

(51) Int. Cl.
*G11C 16/10* (2006.01)
*G11C 16/06* (2006.01)

(56) References Cited

U.S. PATENT DOCUMENTS

| | | | | |
|---|---|---|---|---|
| 5,822,245 | A * | 10/1998 | Gupta et al. | 365/185.12 |
| 6,405,237 | B1 * | 6/2002 | Khalidi et al. | 709/203 |
| 7,206,233 | B2 * | 4/2007 | Shiota et al. | 365/189.04 |
| 7,266,669 | B2 * | 9/2007 | Matsui et al. | 711/202 |
| 7,844,772 | B2 * | 11/2010 | Moon et al. | 711/103 |
| 7,908,426 | B2 * | 3/2011 | Estakhri et al. | 711/103 |
| 8,032,694 | B2 * | 10/2011 | Estakhri et al. | 711/104 |
| 8,473,693 | B1 * | 6/2013 | Muppalaneni et al. | 711/154 |
| 8,832,407 | B2 * | 9/2014 | Horiguchi | 711/171 |
| 2002/0041517 | A1 * | 4/2002 | Kim et al. | 365/185.11 |
| 2002/0108014 | A1 * | 8/2002 | Lasser | 711/103 |
| 2005/0021904 | A1 * | 1/2005 | Iaculo et al. | 711/103 |
| 2005/0169262 | A1 * | 8/2005 | Kasper et al. | 370/389 |
| 2006/0069885 | A1 * | 3/2006 | Matsui et al. | 711/154 |
| 2007/0112848 | A1 * | 5/2007 | Wang | 707/103 R |
| 2007/0208821 | A1 * | 9/2007 | Pittman | 709/213 |
| 2007/0300010 | A1 * | 12/2007 | Yang et al. | 711/103 |
| 2008/0037321 | A1 * | 2/2008 | Luo et al. | 365/185.03 |
| 2008/0195801 | A1 * | 8/2008 | Cheon et al. | 711/103 |
| 2008/0228997 | A1 * | 9/2008 | Farhan et al. | 711/103 |
| 2009/0089328 | A1 * | 4/2009 | Miller | 707/104.1 |
| 2010/0103816 | A1 * | 4/2010 | Eiro | 370/230 |
| 2010/0241788 | A1 * | 9/2010 | Yeh | 711/103 |
| 2010/0293324 | A1 * | 11/2010 | Estakhri et al. | 711/103 |
| 2011/0145306 | A1 * | 6/2011 | Boyd et al. | 707/824 |

FOREIGN PATENT DOCUMENTS

| | | |
|---|---|---|
| JP | 2002-024167 A | 1/2002 |
| JP | 2008-508596 A | 3/2008 |
| JP | 2008-204623 A | 9/2008 |

OTHER PUBLICATIONS

Lee, Jung-Hoon, Gi-Ho Park, and Shin-Dug Kim. "A new NAND-type flash memory package with smart buffer system for spatial and temporal localities." Journal of Systems Architecture 51.2 (2005): 111-123.*

Park, Chanik, et al. "A high performance controller for NAND flash-based solid state disk (NSSD)." Non-Volatile Semiconductor Memory Workshop, 2006. IEEE NVSMW 2006. 21st. IEEE, 2006.*

International Search Report dated Mar. 2, 2010 from PCT/JP2010/051439.

English translation of IPRP dated Sep. 27, 2012 from corresponding PCT/JP2010/051439; 6 pages.

* cited by examiner

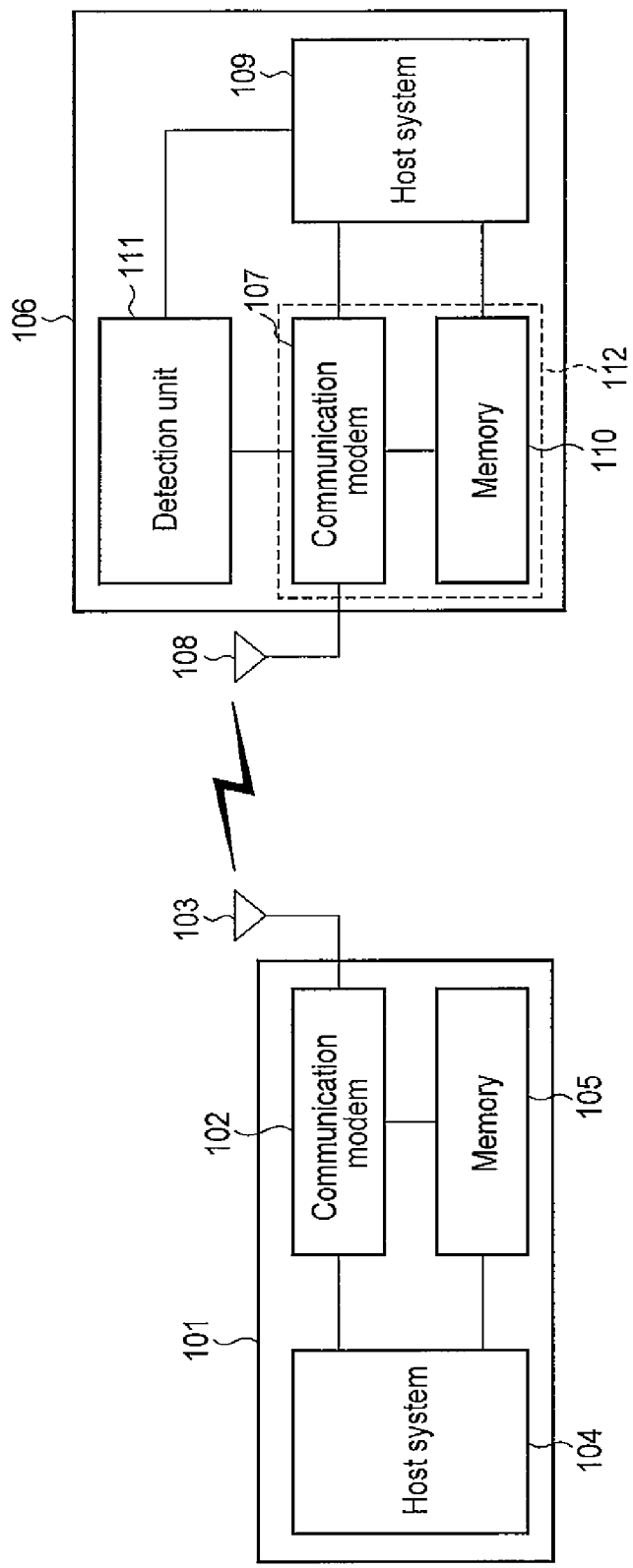
F I G. 1

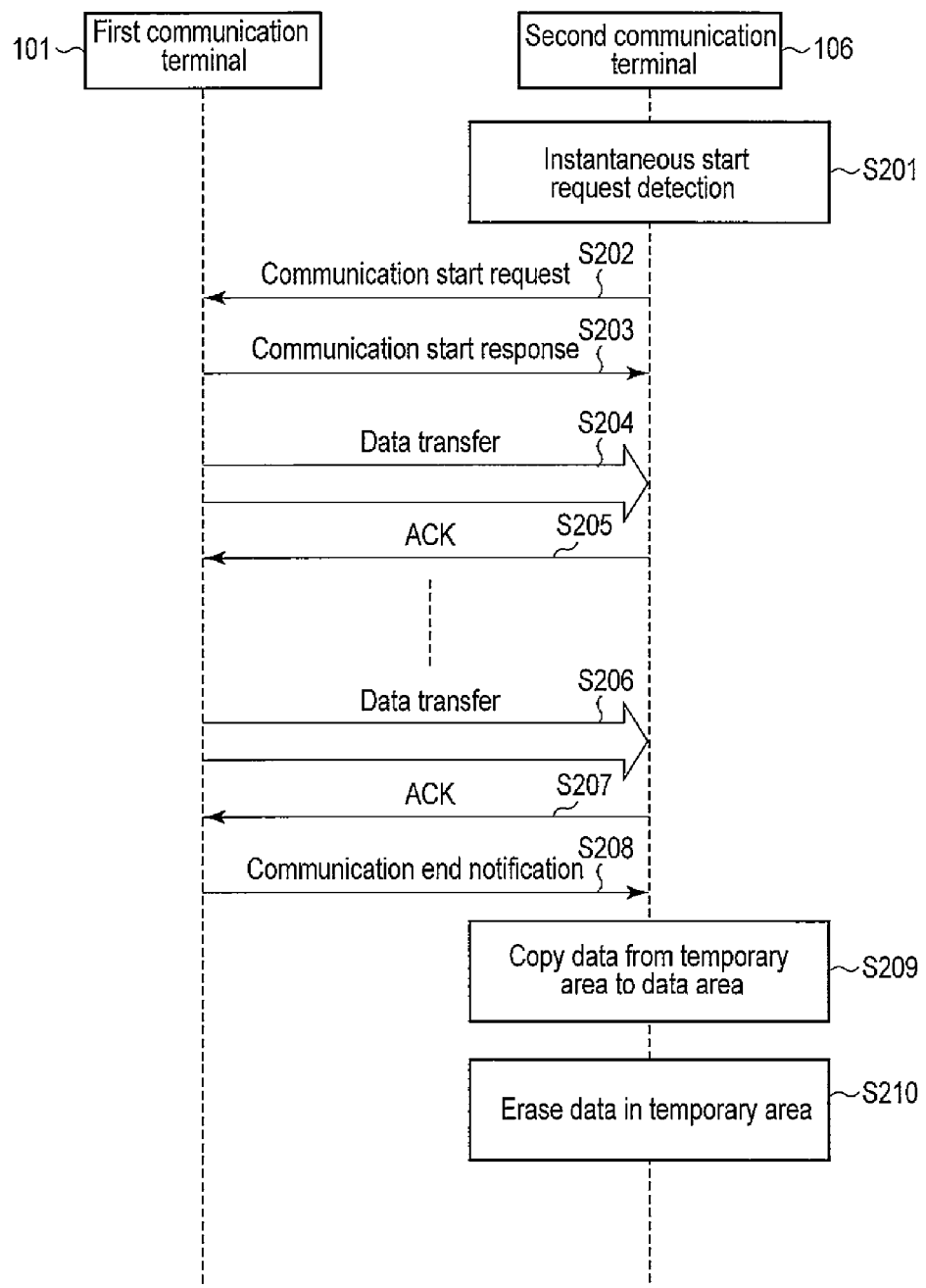
F I G. 2

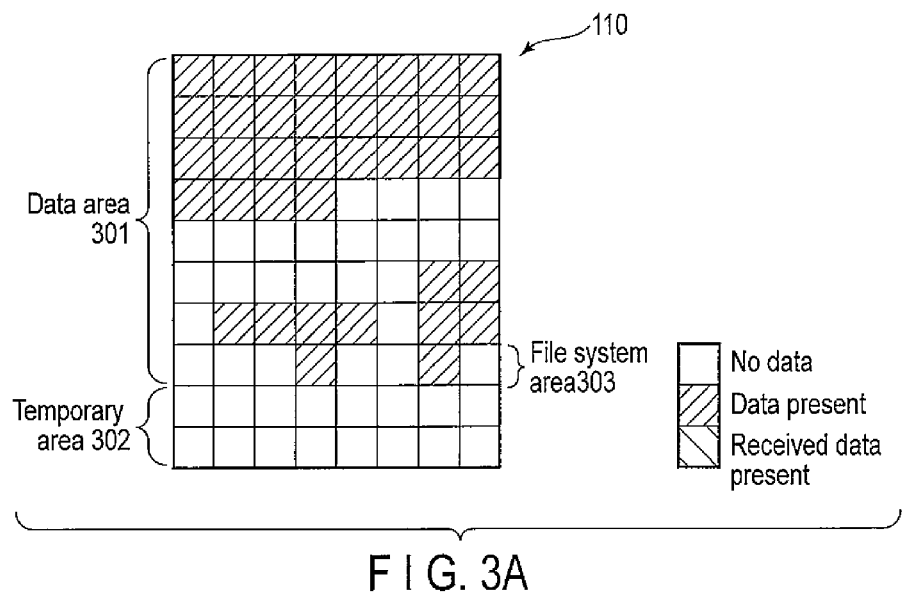
F I G. 3A
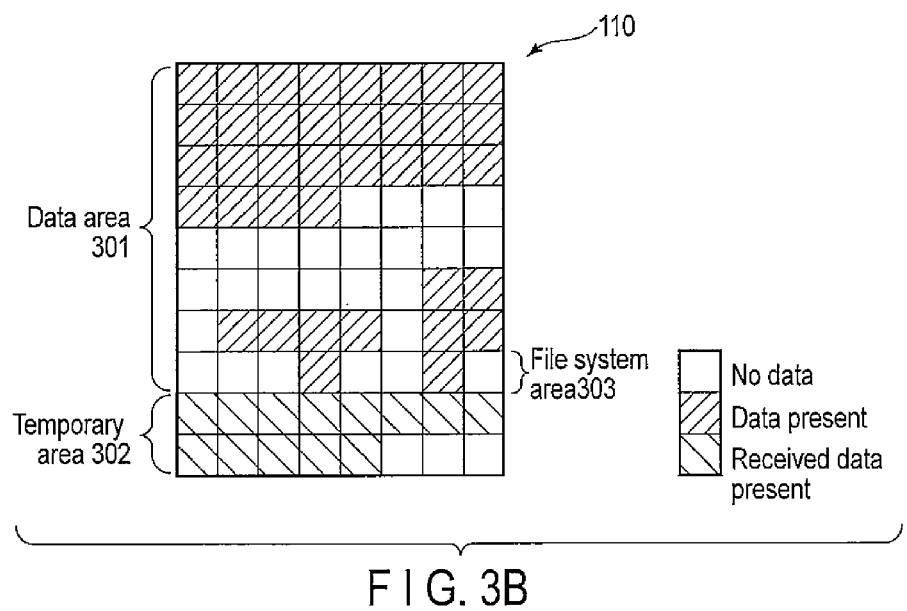
F I G. 3B

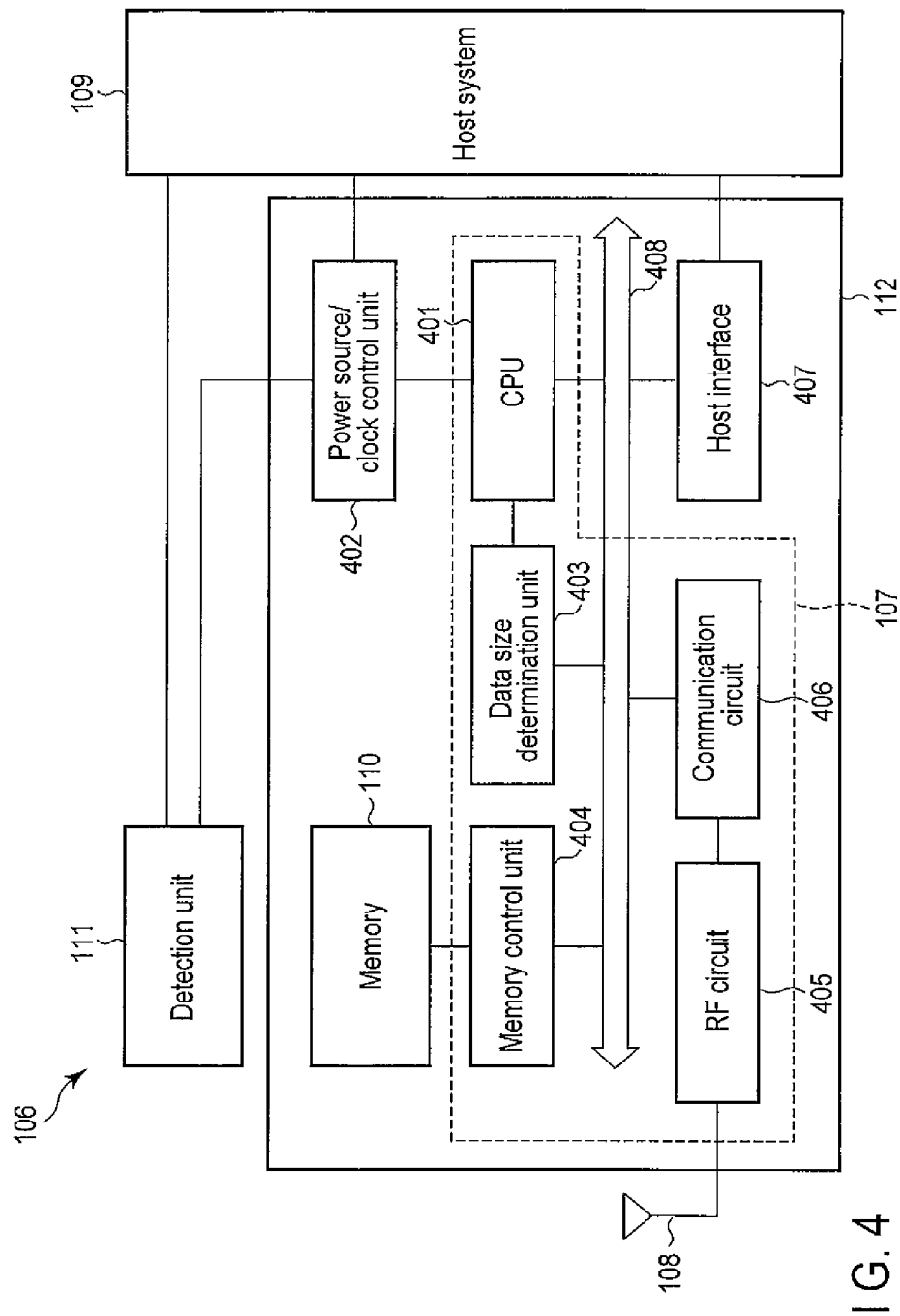
F I G. 4

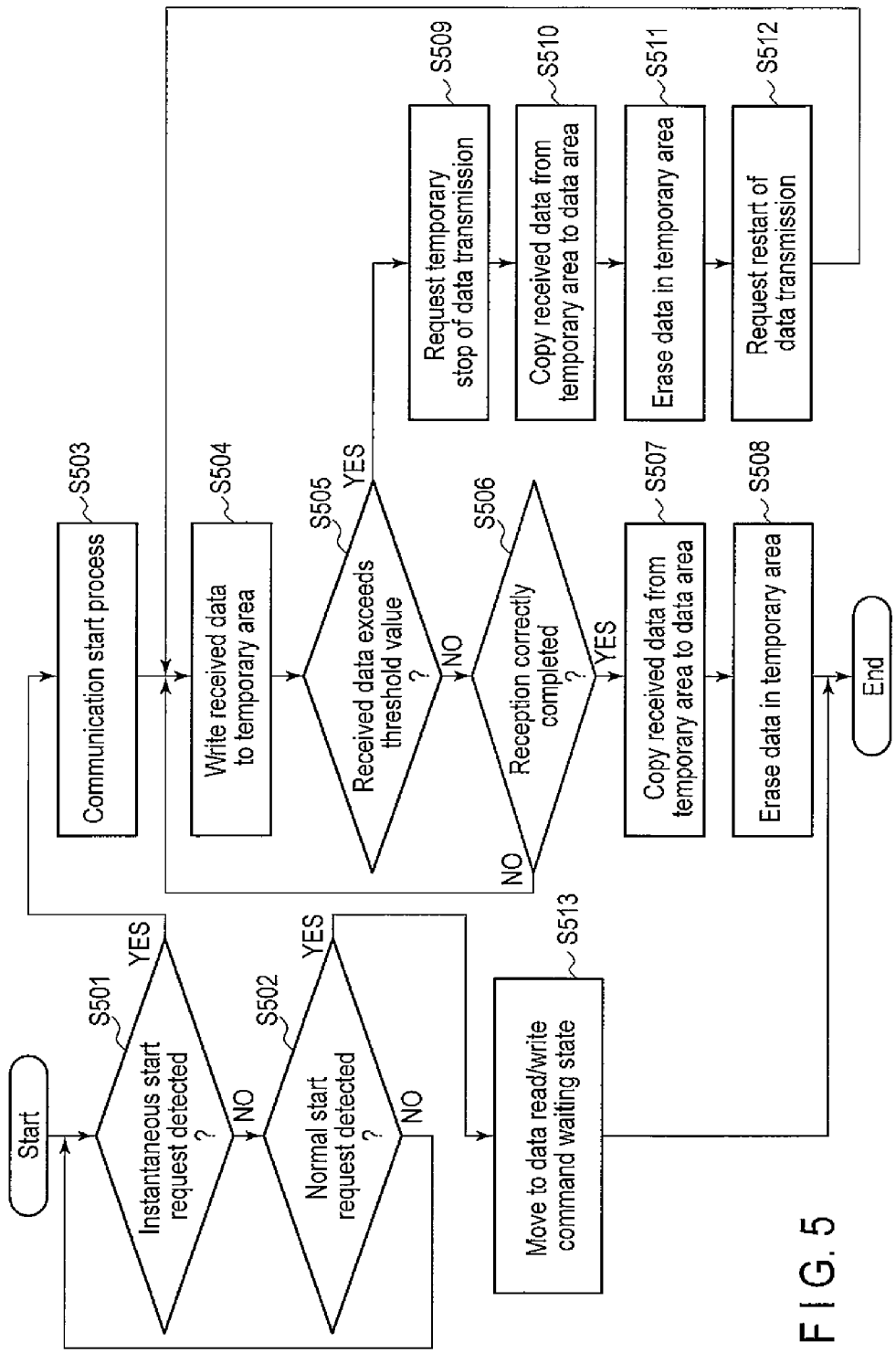
F I G. 5

COMMUNICATION DEVICE WITH FAST START MODE FOR TRANSFERING DATA TO TEMPORARY AREAS BEYOND FILE SYSTEM CONTROL

CROSS REFERENCE TO RELATED APPLICATIONS

This application is a Continuation Application of PCT Application No. PCT/JP2010/051439, filed Feb. 2, 2010, the entire contents of which are incorporated herein by reference.

FIELD

Embodiments described herein relate generally to a wireless communication device with a data storage device.

BACKGROUND

A wireless communication device such as a mobile phone generally includes a nonvolatile memory as a data storage device. A NAND flash memory that is relatively inexpensive among the nonvolatile memories is often used as the nonvolatile memory mounted on the wireless communication device. In the NAND flash memory, when data is overwritten in an area to which data is already written, it is necessary to erase the data in the area before writing the new data. It is known that the throughput of data writing is greatly degraded because of the erase process. For example, the data writing speed in the NAND flash memory sometimes becomes lower than the data transfer rate between wireless communication devices. In this case, it is necessary to provide a temporary buffer of large capacity that stores the received data during the data-erase waiting time in a wireless communication device on the data reception side.

As the technique for increasing the data writing speed in the flash memory, for example, a method that uses a plurality of buffer memories with respect to a main memory is disclosed in JP-A 2008-204623 (KOKAI). Further, a method for providing an extra area in a memory is disclosed in JP-A 10-134559 (KOKAI).

However, in JP-A 2008-204623 (KOKAI), there occurs a problem that the circuit size is increased and the power consumption and cost are increased since it is necessary to prepare a plurality of buffer memories. Further, in JP-A 10-134559 (KOKAI), since it is necessary to provide a large extra area in the memory and perform preprocessing at the data write time, there occurs a problem that the latency until writing is started becomes long. Therefore, the communication device is required to have short latency until writing is started and to receive data at high speed even with a small circuit size.

BRIEF DESCRIPTION OF THE DRAWINGS

FIG. 1 is a block diagram showing a communication system according to one embodiment.

FIG. 2 is a flowchart showing one example of a data transfer process in the communication system shown in FIG. 1.

FIGS. 3A, 3B, 3C, and 3D are explanatory diagrams illustrating the operation of a memory shown in FIG. 1.

FIG. 4 is a block diagram more specifically showing a communication terminal shown in FIG. 1.

FIG. 5 is a flowchart showing one example of a data reception process in the communication terminal shown in FIG. 4.

DETAILED DESCRIPTION

Figure 3C:
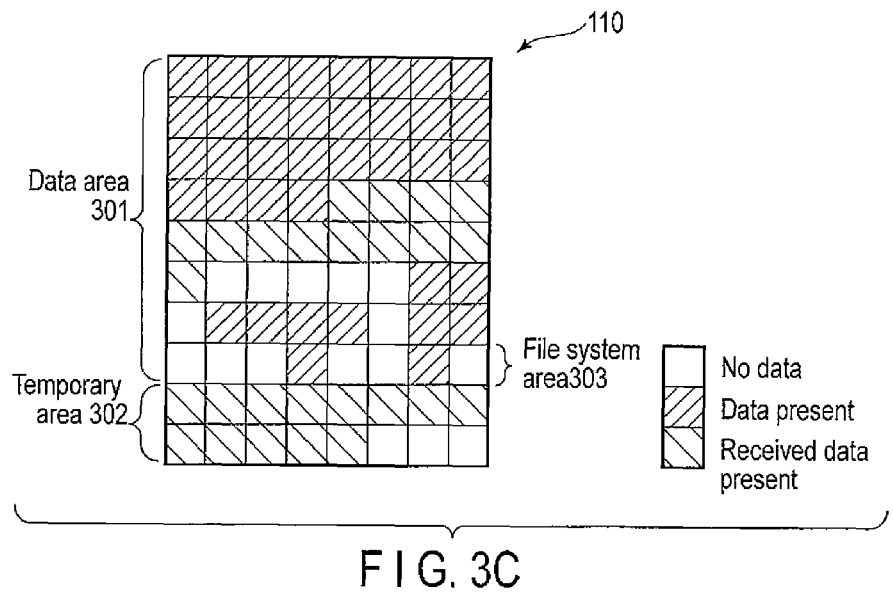

In general, according to one embodiment, a communication device includes a reception unit, a data storage device, and a processing unit. The reception unit is configured to receive data from another communication device. The data storage device includes a data area controlled by a file system and a temporary area which is beyond control of the file system, the temporary area being allocated a fixed logical address. The processing unit is configured to operate in one of a first start mode and a second start mode to write the received data to the data storage device, the first start mode being a mode in which the processing unit is started according to a start request generated at the communication device, the second start mode being a mode in which the processing unit is started according to a start request provided from outside of the communication device, the processing unit being started faster in the second start mode than in the first start mode. If the processing unit operates in the second start mode, the processing unit writes the received data to the temporary area, copies the received data in the temporary area to the data area after completion of data reception, and erases the received data in the temporary area after copying.

One embodiment provides a communication device with a small circuit size which realizes high-speed data communication.

Hereinafter, communication devices according to various embodiments will be described with reference to the accompanying drawings. In the embodiments, like reference numbers denote like elements, and duplication of explanation will be avoided.

First Embodiment

FIG. 1 schematically shows the configuration of a communication system according to one embodiment. As shown in FIG. 1, the communication system includes communication terminals (also referred to as communication devices) 101 and 106 which perform peer-to-peer communication according to a predetermined wireless communication system. In the present embodiment, explained is an example in which data is transferred from the communication terminal 101 to the communication terminal 106. In the following description, the communication terminal 101 on the data transmission side is referred to as a first communication terminal and the communication terminal 106 on the data reception side is referred to as a second communication terminal. The communication device according to the present embodiment corresponds to the communication terminal on the reception side, that is, second communication terminal 106. In the second communication terminal 106, a communication/data storage unit 112 including a communication modem 107 and memory 110 is shown in a simplified form in FIG. 1 and will be explained in detail later with reference to FIG. 4.

The first communication terminal 101 includes a communication modem 102, an antenna 103, a host system 104, and a memory 105. The host system 104 is connected to the communication modem 102 and memory 105 via an interface (not shown). When data is transferred to the second communication terminal 106, the host system 104 writes, to the memory 105, data to be transmitted to the second communication terminal 106. The communication modem 102 reads, from the memory 105, the data to be transmitted to the second communication terminal 106 according to an instruction of the host system 104. The communication modem 102 generates a data signal from the read data by signal processing for wireless communication. The communication modem 102 transmits the data signal via the antenna 103. Further, as will be described later, the communication modem 102 transmits various signals (for example, communication start response, communication end notification and the like) to the second communication terminal 106 and receives various signals (for example, communication start request, acknowledge (ACK) packet and the like) from the second communication terminal 106.

In the present embodiment, assumed as the first communication terminal 101 is a communication device in which a request for low power consumption is low in comparison with a mobile terminal, for example, a stationary terminal such as a desktop personal computer (PC) or television receiver to which power is supplied from the exterior.

The second communication terminal 106 includes a communication modem 107, an antenna 108, host system 109, a memory 110, and a detection unit 111. The host system 109 is connected to the communication modem 107 and memory 110 via a host interface 407 shown in FIG. 4 and connected to the detection unit 111 via an interface (not shown). The communication modem 107 receives a data signal from the first communication terminal 101 via the antenna 108. The communication modem 107 generates data from the received data by signal processing for wireless communication and writes the generated data to the memory 110. Further, the communication modem 107 receives various signals (for example, communication start response, communication end notification and the like) from the first communication terminal 101 and transmits various signals (for example, communication start request, ACK packet and the like) to the first communication terminal 101.

The detection unit 111 detects an instantaneous start request, which is a signal provided from outside of the terminal 106, to generate a trigger that urges start of the communication modem 107 and start of a process. For example, the detection unit 111 detects that a communication partner (for example, first communication terminal 101) approaches. Then, the detection unit 111 notifies a communication/data storage unit 112 about approaching of the communication partner by passing the detection result to a power source/clock control unit 402 (shown in FIG. 4) in the communication/data storage unit 112. For example, the instantaneous start request detected by the detection unit 111 may be a radio signal generated from the communication modem 102 of the first communication terminal 101. Alternatively, the detection unit 111 may detect, as an instantaneous start request, that an input device (not shown) provided in the second communication terminal 106 is operated by the user, for example, that a transfer start button is pressed by the user. The detection unit 111 may detect, as an instantaneous start request, a radio signal generated from another communication system (for example, short-range wireless communication system of infrared communication, Bluetooth (registered trademark), NFC (Near Field Communication), RF-ID (Radio Frequency Identification) or the like) which is not shown in the drawing and is provided in the first communication terminal 101. The detection unit 111 may include a magnetic sensor (not shown) and detect, as an instantaneous start request, a magnetic field generated from the first communication terminal 101, by using the magnetic sensor. Thus, the detection unit 111 detects an instantaneous start request input from the exterior without using the host system.

The second communication terminal 106 operates in one of two start modes, that is, an instantaneous start mode and normal start mode. The instantaneous start mode (also referred to as a second start mode) is a mode in which the communication/data storage unit 112 is started according to a start request provided from outside of the second communication terminal 106, i.e., a mode in which the detection unit 111 starts the communication/data storage unit 112 to make ready for data transfer from a communication partner when the communication partner is detected by the detection unit 111. As will be explained later, the memory 110 is previously partitioned into a data area and temporary area by using a logical address. The data received from the first communication terminal 101 is written to the temporary area in the instantaneous start mode. In this case, the logical address is used when data is read and written, and does not necessarily coincide with a physical address indicating one of memory cells in the memory 110 to which data is to be written.

In the instantaneous start mode, the received data stored in the temporary area is copied to the data area after data reception is completed and then the received data in the temporary area is erased. After the received data in the temporary area is erased, the communication modem 107 notifies the host system 109 about completion of the reception process. After receiving the notification indicating completion of the reception process from the communication modem 107, the host system 109 accesses the memory 110 to use data written to the memory 110.

The normal start mode (also referred to as a first start mode) is a mode in which the communication/data storage unit 112 is started according to a start request generated in the internal portion (for example, the host system 109) of the terminal 106. In the normal start mode, the communication/data storage unit 112 uses the data area in the memory 110 to communicate with the host system 109 and receive data from the first communication terminal 101, without using the temporary area. That is, in the normal start mode, data received from the first communication terminal 101 is written to the data area of the memory 110 and the host system 109 can read and write data with respect to the data area of the memory 110.

In the present embodiment, assumed as the second communication terminal 106 is a communication device in which a request for low power consumption is high in comparison with a stationary terminal (for example, first communication terminal 101), for example, a mobile terminal such as a mobile phone or personal digital assistance (PDA) whose power is supplied from a battery. The communication terminal may be a mobile phone with a short-range wireless communication function such as Felica, RF-ID or the like.

FIG. 2 shows one example of a procedure for transferring data from the first communication terminal 101 to the second communication terminal 106 when the second communication terminal 106 is operated in the instantaneous start mode. As shown in FIG. 2, first, an instantaneous start request is detected by the detection unit 111 of the second communication terminal 106 (step S201). If the detection unit 111 detects a radio signal from the first communication terminal 101 as an instantaneous start request, the detection unit 111 is intermittently started to detect a radio signal (i.e., perform carrier sense) or detects a radio signal by use of a method such as RF-ID and NFC which does not require a power source. Thus, an attempt is made to attain low power consumption at the standby time. When an instantaneous start request is detected by use of a system which can transfer data at a low rate as in NFC, setting information (which includes radio frequency, bandwidth, modulation scheme, error correction coding method, encryption key or the like) used for transferring various messages and data that will be described later and user authentication information may be transferred from the first communication terminal 101 to the second communication terminal 106. When setting information for transferring data together with the instantaneous start request is transmitted to the second communication terminal 106, the communication modem 102 of the first communication terminal 101 and the communication modem 107 of the second communication terminal 106 communicate based on a communication system according to the setting information.

The second communication terminal 106 that has detected the instantaneous start request is started in the instantaneous start mode and transmits a communication start request to the first communication terminal 101 (step S202). When receiving a communication start request from the second communication terminal 106, the first communication terminal 101 transmits a communication start response to the second communication terminal 106 if it is set in a state in which data can be transferred (step S203). The second communication terminal 106 confirms that the first communication terminal 101 is communicable by receiving the communication start response from the first communication terminal 101.

After transmitting the communication start response to the second communication terminal 106, the first communication terminal 101 starts to transfer data as a data signal to the second communication terminal 106 (step S204). Data transferred by the first communication terminal 101 may be transferred in one packet (or frame) or may be divided into plural packets (or frames) and transferred. While receiving data from the first communication terminal 101, the second communication terminal 106 writes received data to the temporary area of the memory 110. Further, when receiving data from the first communication terminal 101, the second communication terminal 106 transmits an ACK packet (or ACK frame) as a reception confirmation response to the first communication terminal 101 (step S205). In the example shown in FIG. 2, packet communication is assumed and the second communication terminal 106 returns an ACK packet with respect to data transfer by the first communication terminal 101, but the process is not limited to this case and it is not necessary for the second communication terminal 106 to return an ACK package depending on an application.

If data is divided into a plurality of packets (or frames) and transferred, data transfer and ACK return are repeatedly performed as shown in steps S206 and S207. The first communication terminal 101 confirms that data transfer is successfully performed by receiving the ACK packet (or ACK frame) returned from the second communication terminal 106.

When terminating transfer of data, the first communication terminal 101 transmits a communication end notification to the second communication terminal 106 (step S208). The second communication terminal 106 recognizes that data transfer by the first communication terminal 101 is completed by receiving the communication end notification. In the second communication terminal 106, the received data in the temporary area is copied to the data area after data transfer by the first communication terminal 101 is completed (step S209). After a copy process is completed, the data in the temporary area is erased (step S210).

As a method for permitting the second communication terminal 106 to determine whether or not communication is terminated, a method that uses the second communication terminal 106 that includes a timer whose count is reset to zero when a data packet is received and determines that communication is terminated if a packet is not received for a predetermined time period may be provided other than the method for receiving the communication end notification from the first communication terminal 101.

Further, in the example shown in FIG. 2, the second communication terminal 106 that has detected the instantaneous start request transmits the communication start request, but the process is not limited to this case. Communication may be set up between the first and second communication terminals 101 and 106 by use of another method. For example, the first communication terminal 101 continuously transmits a communication start request and the second communication terminal 106 starts to search for (or perform carrier sense) the communication start request that may be transmitted from the first communication terminal 101 after detecting an instantaneous start request. In this case, when successfully receiving the communication start request, the second communication terminal 106 returns the communication start response to the first communication terminal 101.

When an instantaneous start request is detected by use of a system that transfers data at a low rate as in NFC, the communication start request and response are transferred by use of an NFC system and then system handover may be performed to transfer data by use of a communication modem.

FIG. 3A schematically shows the configuration of the memory 110 in the second communication terminal 106. As shown in FIG. 3A, the memory 110 includes a data area 301 that stores data (or file) and a temporary area 302 functioning as a buffer. The data area 301 and temporary area 302 are partitioned or divided by using a logical address. The logical address is an address used when the host system 109 accesses the memory 110.

The data area 301 includes a file system area 303 that stores a file system. The file system records control information used for controlling a file and folder in the data area 301 and controls the file and folder stored in the data area 301 by using the control information. A data recording method for the memory 110, an access method with respect to the file and folder and the like are determined in the file system. The data area 301 is an area in which the file and folder are controlled by the file system. The temporary area 302 is not controlled by the file system or is an area beyond the control of the file system. Therefore, for example, an application executed on the host system 109 to access the memory 110 via the file system cannot access the temporary area 302.

The memory 110 of the present embodiment is, for example, a NAND flash memory. In the NAND flash memory, data writing and reading are performed in a page unit and data erase is performed in a block unit, where a page is formed by a plurality of memory cells and a block is formed by a plurality of pages. Each of the data area 301 and temporary area 302 includes a plurality of blocks. In FIG. 3A, one square box indicates one block. Unique physical addresses are allocated to respective pages. Alternatively, the physical addresses may be allocated to respective blocks.

In the NAND flash memory, it is impossible to overwrite data in the block that is already written. Therefore, when data is overwritten in the block that is already written, new data is written after data in the block is erased. Further, when a portion of data stored in the block is rewritten, new data to be rewritten is written to another block that has already been erased and the other portion of the data stored in the block, which is not rewritten, is copied to the other block. Generally, in the NAND flash memory, overhead occurs because of erasing of data and copying of data in the block, and therefore the data writing speed is lowered. In the present embodiment, since data received from the first communication terminal 101 is stored in the temporary area 302 that has already been erased, overhead due to erasing of data and copying of data in the block does not occur and data received at the second communication terminal 106 is instantly written to the memory 110. Therefore, a temporary buffer (not shown) provided in the second communication terminal 106 (for example, in the communication circuit shown in FIG. 4) used for waiting for erasing of the memory 110 can be made small.

The memory 110 is not limited to the NAND flash memory and can be any type of nonvolatile memory if the memory is a memory in which data of an area having data written therein is required to be erased when data is overwritten in the area.

Next, the operation example of the memory 110 is explained with reference to FIG. 3A to FIG. 3D.

Figure 3D:
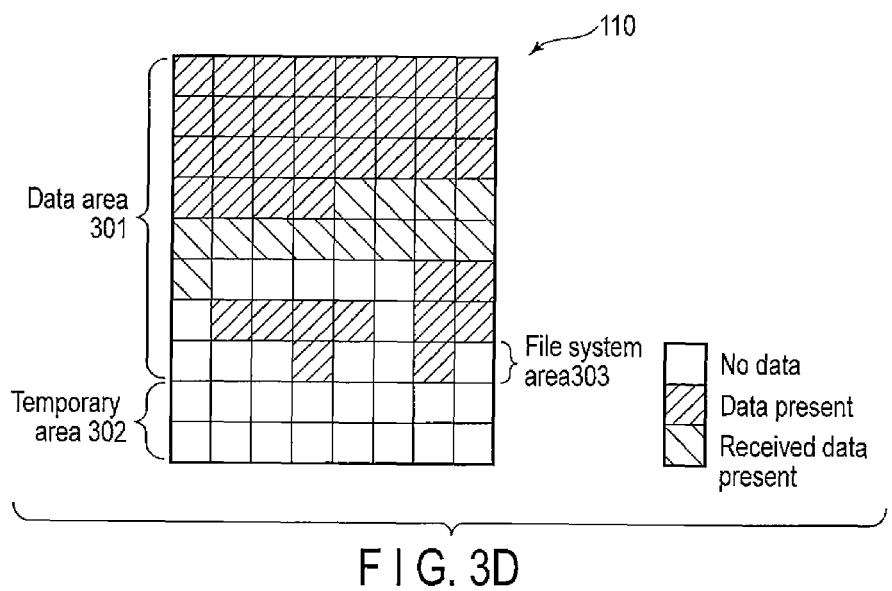

As shown in FIG. 3A, the temporary area 302 in the memory 110 is kept set in an erased state to make preparations for reception of data. As shown in FIG. 3B, data received at the second communication terminal 106 is written to the temporary area 302 without accessing the file system. As shown in FIG. 3C, the received data stored in the temporary area 302 is copied to an appropriate address (for example, preset folder, route folder or the like) of the data area 301 according to information of the file system after a series of data receptions is completed. At this time, if the memory is a memory in which data cannot be overwritten in an area having data already written therein like the flash memory, the received data is written after data in an address (that is, block) to which the received data is written has been erased. After copying of the received data from the temporary area 302 to the data area 301 is completed, as shown in FIG. 3D, the received data stored in the temporary area 302 is erased to make preparations for next data reception.

In the above method, as shown in FIG. 3C, the received data is copied from the temporary area 302 in which the logical address is fixed to the data area 301, but the process is not limited to this case. By converting the logical address, the temporary area 302 to which the received data is written may be changed to the data area 301 and an unused area of the data area 301 may be changed to the temporary area 302. The unused area is an area in which data is erased. Thus, data in the temporary area 302 can be erased by exchanging logical addresses between the data area 301 and the unused area of the data area 301 or by exchanging the logical address allocated to the temporary area 302 for the logical address allocated to the unused area of the data area 301.

FIG. 4 more specifically shows the configuration of the second communication terminal 106 according to the present embodiment. As shown in FIG. 4, the second communication terminal 106 includes the communication/data storage unit 112 with a wireless communication function and data storage function, the antenna 108, the host system 109, and the detection unit 111. The antenna 108 may be included in the communication/data storage unit 112.

The communication/data storage unit 112 includes a CPU 401, a power source/clock control unit 402, a memory 110 used as a data storage device, a data size determination unit 403, a memory control unit 404, a radio-frequency (RF) circuit 405, a communication circuit 406, and a host interface 407. The respective modules or units are connected to one another via a data bus 408. The communication modem 107 shown in FIG. 1 includes the CPU 401, the data size determination unit 403, the memory control unit 404, the RF circuit 405, and the communication circuit 406. The RF circuit 405 and communication circuit 406 are operated as the reception unit of the second communication terminal 106.

The communication/data storage unit 112 is connected to the host system 109 via the host interface 407. The host interface 407 exchanges data with the host system 109.

The detection unit 111 is controlled by the host system 109. The detection unit 111 detects an instantaneous start request to output a detection signal. The detection unit 111 notifies the power source/clock control unit 402 that the instantaneous start request is detected. The power source/clock control unit 402 starts to supply the power and clock to the respective modules such as the CPU 401 according to the notification of the instantaneous start request. Therefore, the communication/data storage unit 112 is started in the instantaneous start mode. In the instantaneous start mode, the communication/data storage unit 112 is started faster or in a shorter time period in comparison with the normal start mode. On the other hand, when a start request is notified from the host system 109 to the power source/clock control unit 402, the communication/data storage unit 112 is started in the normal start mode. One of the start modes in which the communication terminal 106 is started is notified from the power source/clock control unit 402 to the CPU 401.

The CPU (also referred to as a processing unit) 401 reads a control program stored in a ROM (not shown) and controls the operations of the respective modules according to the control program. The CPU 401 can access the memory 110 to read and write data with respect to the data area 301 and temporary area 302 in the memory 110. The CPU 401 is operated according to a start mode notified from the power source/clock control unit 402. In the instantaneous start mode, the CPU 401 transmits various signals or messages (for example, communication start request and the like) via the communication circuit 406 and RF circuit 405. Further, the CPU 401 writes data received from the first communication terminal 101 to the temporary area 302 of the memory 110 via the memory control unit 404. Then, the CPU 401 reads the received data stored in the temporary area 302 of the memory 110, writes the read received data to the data area 301 of the memory 110 and erases the received data in the temporary area 302 of the memory 110.

In the normal start mode, the CPU 401 is set in a state to wait for accessing from the host system 109 to the memory 110. Further, in the normal start mode, the CPU 401 transmits various signals or messages used for communication with a communication partner (not shown) via the communication circuit 406 and RF circuit 405 according to a request from the host system 109.

The communication circuit 406 performs signal processing for converting an analog signal to a digital signal, converting a digital signal to an analog signal and the like. The communication circuit 406 includes a temporary buffer (not shown) used for busy waiting of the data bus 408 and waiting for erasing of the memory 110. The RF circuit 405 performs a frequency conversion and amplification process and the like for wireless communication. The antenna 108 receives radio waves from the first communication terminal 101 to obtain a received signal (for example, data signal, communication start response, communication end notification or the like). The received signal is filtered, amplified and down-converted by the RF circuit 405 and converted to a digital signal by the communication circuit 406. The communication circuit 406 passes the received signal to the CPU 401. The CPU 401 recognizes that data transfer by the first communication terminal 101 is started by receiving a communication start response from the reception unit.

A message or signal (for example, communication start request, ACK packet or the like) transmitted to the first communication terminal 101 is generated from the CPU 401 or the like. The message generated from the CPU 401 is converted to an analog signal by the communication circuit 406, up-converted, amplified and filtered by the RF circuit 405 and transmitted from the antenna 108 as radio waves.

The memory control unit 404 converts a logical address specified by the host system 109 or CPU 401 to a corresponding physical address when data is written to or read from the memory 110. Further, the memory control unit 402 performs error correction coding and decoding and the like with respect to data to be transmitted and received.

The data size determination unit 403 determines whether or not the size of data received from the first communication terminal 101 exceeds a predetermined threshold value. Alternatively, the data size determination unit 403 may determine whether or not the size of data received from the first communication terminal 101 exceeds a size or capacity of the temporary area 302. The data size determination unit 403 notifies the CPU 401 about the determination result. The threshold value is preferably set to the same value as the size of the temporary area 302 of the memory 110 but may be set to a value smaller than the size of the temporary area 302. The data size determination unit 403 is shown as a hardware module in FIG. 4, but the unit is not limited to the module and may be software executed on the CPU 401.

FIG. 5 shows one example of a procedure for receiving data in the communication terminal 106 according to the present embodiment. As shown in step S501 and step S502 of FIG. 5, the second communication terminal 106 is kept set in a standby state until either an instantaneous start request or normal start request is detected. If the instantaneous start request is detected in step S501, the process proceeds to step S503. When the instantaneous start request is detected by the detection unit 111, the second communication terminal 106 is started in the instantaneous start mode to start communication with the first communication terminal 101 (step S503). Specifically, in step S503, as shown in steps S202 and S203 in FIG. 2, the second communication terminal 106 transmits a communication start request to the first communication terminal 101 and the first communication terminal 101 transmits a communication start response to the second communication terminal 106 in response to this request. After this, the first communication terminal 101 starts data transfer.

Data received at the second communication terminal 106 is written to the temporary area 302 of the memory 110 (step S504). Then, the data size determination unit 403 determines whether or not the received data exceeds a predetermined threshold value (step S505). For example, in the second communication terminal 106, a counter provided in the data size determination unit 403 counts a size or amount of the received data and compares the size of the received data with the threshold value. The threshold value is set to a value that is not larger than the size (or capacity) of the temporary area 302. If it is determined in step S505 that the received data exceeds the threshold value, the process proceeds to step S509.

If the received data exceeds the threshold value, the second communication terminal 106 requests the first communication terminal 101 to temporarily stop data transfer (step S509). For example, the request is included in an ACK packet and transmitted. Then, the received data stored in temporary area 302 is copied to the data area 301 according to information of the file system (step S510). After the copy process is completed, the received data in the temporary area 302 is erased (step S511). Then, the second communication terminal 106 requests the first communication terminal 101 to restart data transfer (step S512). Further, in the second communication terminal 106, the counter for counting the amount of received data is reset. When receiving a data transfer restart request, the first communication terminal 101 restarts data transfer. When data transfer is restarted, the process returns to step S504. In step S504, data received at the second communication terminal 106 is written to the temporary area 302 of the memory 110. If the received data exceeds the threshold value again, the process of step S509 to step S512 is repeatedly performed.

In the second communication terminal 106, communication modem 107 detects the end of data transfer from the first communication terminal 101 by, for example, receiving a communication completion notification from the first communication terminal 101. Then, communication modem 107 determines whether or not data reception is correctly completed (step S506). If data reception is not correctly completed or if an error occurs in the received data depending on the state of the transmission path, data in the temporary area 302 is erased to discard the received data written to the temporary area in the second communication terminal 106. The communication modem 107 of the second communication terminal 106 requests the first communication terminal 101 to transmit data again, the process returns to step S504 and data is received again from the first communication terminal 101.

If data is correctly received in step S506, the process proceeds to step S507 and the received data in the temporary area 302 is copied to a folder of the data area 301 according to information of the file system (step S507). After completion of the copy process, the received data in the temporary area 302 is erased (step S508) and a series of reception processes is terminated.

On the other hand, if the normal start request is detected in step S502, the process proceeds to step S513. In step S513, the CPU 401 is set to a command waiting state to make ready for a case wherein a data read/write command is issued from the host system 109 to the memory 110.

In FIG. 5, an example in which the second communication terminal 106 requests temporary stop of data transfer in step S509 is shown, but the process is not the limited case and the second communication terminal 106 may repeatedly request retransmission of data to the first communication terminal 101 while the copy and erase process for the received data is being performed in the second communication terminal 106. In this case, it is preferable to separate the data retransmission request from the data retransmission request issued when an error occurs in the received data depending on the state of the transmission path.

As described above, if the communication device according to the present embodiment operates in the instantaneous mode, the communication device writes the received data obtained by data communication to the temporary area of the memory, without performing the erase process and accessing the file system. Therefore, the latency for memory writing can be reduced and the received data can be recorded on the memory at high speed. As a result, the temporary buffer used for waiting for erasing of the memory can be made small to attain a reduction in the circuit scale, low cost and low power consumption.

According to at least one of the embodiments described above, data can be received at high speed while suppressing the circuit size to the small size. At least one of the embodiments can be applied to a wireless communication device that realizes high-speed data communication.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A communication device comprising:
   a reception unit configured to receive data from another communication device;

a data storage device including a data area controlled by a file system and a temporary area which is beyond control of the file system, the temporary area being allocated a fixed logical address; and a processing unit configured to operate in one of a first start mode and a second start mode to write the received data to the data storage device, the first start mode being a mode in which the processing unit operates according to a start request generated at the communication device, the second start mode being a mode in which the processing unit operates according to a start request provided from outside of the communication device, the processing unit having a startup time that is shorter in the second start mode than in the first start mode, wherein if the processing unit operates in the second start mode, the processing unit writes the received data to the temporary area, copies the received data in the temporary area to the data area after completion of data reception, and erases the received data in the temporary area after copying.

2. The device according to claim 1, wherein the processing unit writes the received data to the data area if the processing unit operates in the first start mode.

3. The device according to claim 1, wherein the processing unit requests the other communication device to temporarily stop data transmission when a size of the received data exceeds a predetermined threshold value while the received data is being written to the temporary area, copies the received data in the temporary area to the data area, erases the received data in the temporary area after copying, and requests the other communication device to restart data transmission after the received data in the temporary area is erased.

4. A communication device comprising:

a reception unit configured to receive data from another communication device;

a data storage device including a data area controlled by a file system and a temporary area which is beyond control of the file system; and a processing unit configured to operate in one of a first start mode and a second start mode to write the received data to the data storage device, the first start mode being a mode in which the processing unit operates according to a start request generated at the communication device, the second start mode being a mode in which the processing unit operates according to a start request provided from outside of the communication device, the processing unit having a startup time that is shorter in the second start mode than in the first start mode, wherein if the processing unit operates in the second start mode, the processing unit writes the received data to the temporary area, and exchanges logical addresses between the temporary area and an unused area of the data area to erase the received data in the temporary area after completion of data reception.

5. The device according to claim 4, wherein the processing unit requests the other communication device to temporarily stop data transmission when a size of the received data exceeds a predetermined threshold value while the received data is being written to the temporary area, exchanges logical addresses between the temporary area and the unused area of the data area to erase the received data in the temporary area, and requests the other communication device to restart data transmission after the received data in the temporary area is erased.

6. The device according to claim 4, wherein the processing unit writes the received data to the data area if the processing unit operates in the first start mode.

* * * * *